United States Patent [19]

Ramakrishnan et al.

[11] Patent Number: 5,626,728
[45] Date of Patent: May 6, 1997

[54] PIEZOELECTRIC LEAD ZIRCONIUM TITANATE DEVICE AND METHOD FOR FORMING SAME

[75] Inventors: Ed S. Ramakrishnan; Wei-Yean Howng, both of Albuquerque, N.M.

[73] Assignee: Motorola, Inc., Schaumburg, Ill.

[21] Appl. No.: 250,214

[22] Filed: May 27, 1994

Related U.S. Application Data

[62] Division of Ser. No. 57,027, May 5, 1993, Pat. No. 5,338,999.

[51] Int. Cl.$^6$ .............................. C23C 14/34; B05D 5/12
[52] U.S. Cl. ................. 204/192.18; 204/192.22; 204/192.15; 427/100; 427/126.3; 427/376.2; 427/419.3; 427/559; 427/545
[58] Field of Search .............. 204/192.11, 192.12, 204/192.15, 192.18, 192.17, 192.22, 192.26, 192.27, 192.29; 427/100, 162, 103, 126.3, 255.7, 376.2, 376.3, 419.3, 543, 545, 559

[56] References Cited

U.S. PATENT DOCUMENTS

| | | | |
|---|---|---|---|
| 3,220,938 | 11/1965 | McLean et al. | 204/192.22 |
| 3,997,690 | 12/1976 | Chen | 204/192.26 |
| 4,437,139 | 3/1984 | Howard | 204/192.22 |
| 4,691,104 | 9/1987 | Murata et al. | 250/338 |
| 4,862,029 | 8/1989 | Kasai et al. | 310/311 |
| 4,888,246 | 12/1989 | Kuwata et al. | 204/192.22 |
| 4,952,832 | 8/1990 | Imai et al. | 310/313 A |
| 5,036,241 | 7/1991 | Michaelis et al. | 310/338 |
| 5,075,652 | 12/1991 | Kugai | 333/193 |
| 5,091,669 | 2/1992 | Mitsutsuka | 310/313 A |
| 5,196,101 | 3/1993 | Thakoor | 204/192.18 |
| 5,198,269 | 3/1993 | Swartz et al. | 427/226 |
| 5,248,564 | 9/1993 | Ramesh | 428/688 |
| 5,265,315 | 11/1993 | Haisington et al. | 26/25.5 |
| 5,308,462 | 5/1994 | Iijima et al. | 204/192.18 |

FOREIGN PATENT DOCUMENTS

| | | | |
|---|---|---|---|
| 62-236797 | 10/1988 | Japan | 204/192.18 |

OTHER PUBLICATIONS

"Synthesis of Highly Oreinted Lead Zirconate—Lead Titanate Film Using Metallo–Organics" by S. Hirang et al., Journal of American Ceramic Soc. 1992.

"PZT Thin Film Preparation on PT–Ti Electrode, by RF Sputtering" by K Abe et al., Japanese Journal o Applied Physics, Sep. 1991.

Primary Examiner—R. Bruce Breneman
Assistant Examiner—Rodney G. McDonald
Attorney, Agent, or Firm—Douglas D. Fekete

[57] ABSTRACT

A piezoelectric device, such as a surface acoustic wave filter, comprises a piezoelectric film composed of a lead zirconium titanate compound applied to a substrate formed of silicon or gallium arsenide. The device includes an intermediate film between the piezoelectric film and the substrate and composed of a lead-free zirconium titanate compound to prevent interaction between lead oxide in the piezoelectric material and the material of the substrate that would otherwise cause spilling or adversely effect the electrical properties of the substrate. The piezoelectric device is made by first applying the film of the lead-free zirconium titanate compound and thereafter applying the film of the lead zirconium titanate compound. Preferably, the lead-free zirconium titanate film is applied by sputtering and annealed to densify the material and increase the dielectric constant prior to depositing the piezoelectric material.

11 Claims, 1 Drawing Sheet

PIEZOELECTRIC LEAD ZIRCONIUM TITANATE DEVICE AND METHOD FOR FORMING SAME

This is a division of application Ser. No. 08/057,027, filed on May 5, 1993, now U.S. Pat. No. 5,338,999.

BACKGROUND OF THE INVENTION

This invention relates to a device comprising a thin film composed of a piezoelectric lead zirconium titanate compound and applied to a substrate formed of silicon or gallium arsenide. More particularly, this invention relates to such device comprising an intermediate film formed of non-piezoelectric lead-free zirconium titanate material to improve adhesion of the piezoelectric film to the substrate.

Piezoelectric materials are utilized in many types of electronic devices. For example, a surface acoustic wave filter, commonly referred to as a SAW filter, typically comprises spaced transducers attached to the surface of a piezoelectric film. An oscillating electrical signal applied to a first transducer creates acoustic waves that transverse the piezoelectric surface and, depending upon frequency and spacing, stimulates a second transducer to produce an output electrical signal. Such filters are effective to select signals having frequencies within a relatively narrow passband from a broad spectrum.

A preferred piezoelectric material is composed of lead zirconium titanate compound. As used herein, lead zirconium titanate refers to an oxide containing, as metallic constituents, predominantly lead, zirconium and titanium and optionally containing a minor amount of lanthanum, niobium, antimony, tungsten, tantalum, barium, strontium, neodymium, tin or other metallic agent in substitution for a portion of the lead to enhance particular electrical properties thereof. A thin film of the compound is sputtered onto a substrate, after which it is necessary to anneal the film at a temperature between about 500° C. and 750° C. to form a fine crystalline microstructure that brings about the desired piezoelectric properties. It has been proposed to deposit the piezoelectric film onto a silicon substrate of the type used in forming an integrated circuit die to permit the film to be combined with other electrical features. However, the compound contains lead oxide that reacts with silicon at the relatively high temperatures required to anneal the lead zirconium titanate and produces a glass phase at the interface that tends to crack, even during cooling following anneal, resulting in spalling of the piezoelectric film. This problem is exasperated by stresses created by differences in the coefficients of thermal expansion between the lead zirconium titanate compound and the silicon. Lead zirconium titanate similarly exhibits poor adhesion when applied to a substrate formed of gallium arsenide, an alternate material for integrated circuit die. Moreover, diffusion of lead into the gallium arsenide significantly affects the electrical properties of the substrate.

It has been proposed to apply platinum and titanium layers to separate the lead zirconium titanate and the substrate. The lead zirconium titanate is deposited onto the platinum layer to prevent interaction with the silicon, whereas the titanium forms a protective barrier to inhibit interaction between the platinum and the silicon that would otherwise occur at the lead zirconium titanate annealing temperature and lead to crack formation. These dual layers not only contribute significantly to the cost, but also, being formed of conductive metal, may affect electrical features in the substrate. Moreover, at the annealing temperatures, interaction between the titanium and the platinum layers tends to produce a rough surface in the piezoelectric layer that causes significant acoustic losses. Thus, there remains a need for a piezoelectric device that permits the preferred lead zirconium titanate compound to be applied to a substrate formed of silicon or gallium arsenide without requiring a metallic barrier and without reducing the acoustic properties of the piezoelectric layer.

SUMMARY OF THE INVENTION

This invention contemplates a device that includes an intermediate dielectric film for bonding a piezoelectric lead zirconium titanate film to a substrate formed of either silicon or gallium arsenide. The intermediate film is composed of a lead-free zirconium titanate material and not only tightly bonds the piezoelectric material to the substrate, but also provides a barrier to protect the substrate from the lead compounds that would otherwise form unwanted glassy phases, or interfere with the electrical properties of the substrate.

In another aspect of this invention a method for coating a piezoelectric layer onto a silicon or gallium arsenide substrate comprises applying a first film composed of a lead-free zirconium titanate prior to applying a second film composed of a lead zirconium titanate compound having the desired piezoelectric properties. Preferably, the first film is applied by sputtering and is annealed to densify the zirconium titanate compound to obtain a dielectric constant between about 25 and 60, prior to sputtering and annealing of the piezoelectric film.

BRIEF DESCRIPTION OF THE DRAWINGS

The present invention will be further illustrated with reference to the accompanying drawings wherein the only

DETAILED DESCRIPTION OF THE INVENTION

Figure 1:
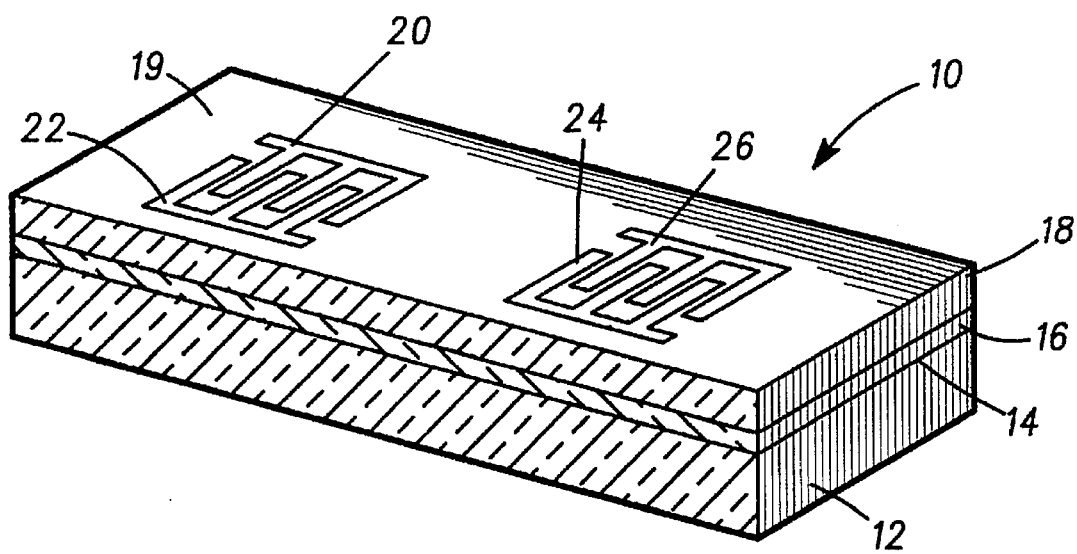
FIG. 1 is a perspective view, partially cut away, of a surface acoustic wave filter formed in a accordance with this invention.

In a preferred embodiment of this invention, referring to the FIGURE, a surface acoustic wave (SAW) filter 10 comprises a substrate 12 having a planar surface 14. Substrate 12 is preferably formed of single crystal silicon of the type commonly utilized in integrated circuit die and may include electrical features that are conventionally formed in such die.

In accordance with this invention, a first thin film 16 is sputtered onto surface 14 and formed of a non-piezoelectric lead-free zirconium titanate material characterized by the formula:

$$Zr_yTi_{1-y}O_4$$

where y is between about 0.3 to 0.65 and preferably is between about 0.4 and 0.6. The film has a thickness between 750 and 2,500 Angstroms, preferably between 1000 and 2000 Angstroms, and a dielectric constant between about 25 and 60.

Filter 10 also includes an outermost thin film 18 formed of piezoelectric lead zirconium titanate compound characterized by the following formula:

$$Pb_aM_{1-a}(Zr_bTi_{1-b})O_3$$

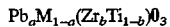

where M is optional and may be a metal selected from the group consisting of lanthanum, niobium, antimony, tungsten, tantalum, barium, strontium, neodymium, and tin; a is between about 0.9 and 1.0 and b is between about 0.5 and 0.7. A preferred metal M is lanthanum. Film 18 is deposited by sputtering directly onto film 16 and preferably is between about 2 microns and 10 microns thick.

Piezoelectric film 18 includes an exposed surface 19. A first set of interdigitated transducers 20 and 22 are applied onto surface 19. During use, transducers 20 and 22 are connected to wire leads for applying an input electrical signal to the transducers. Similarly, a second set of interdigitated transducers 24 and 26 are applied onto surface 19 spaced apart from transducers 20 and 22 and are adapted for connection to wire leads for receiving an output signal from filter 10. During operation, an oscillating electrical signal is applied to transducers 20 and 22. This input signal creates acoustic waves in the piezoelectric film 18 that transverses surface 19 and, depending upon frequency and distance, stimulates transducers 24 and 26 to produce an output signal. For a predetermined spacing between the transducers, only frequencies within a narrow band, referred to as the passband, stimulate an output signal, thereby permitting the device to act as a filter in selecting signals within the passband from a broad spectrum.

Filter 10 is manufactured by coating a preformed substrate 12. In a first step, thin film 16 is deposited onto surface 14 by sputtering utilizing an RF magnetron sputtering apparatus. A suitable target is prepared from a mixture of zirconium dioxide powder and titanium dioxide powder. Sputtering is carried out in an atmosphere composed of argon and oxygen at a pressure between about 8 and 25 millitorr, preferably between 10 and 15 millitorr. The ratio of argon to oxygen is between about 4 and 20, preferably between about 8 and 12. Sputtering is carried out at a power between 1.5 and 4.5 watts per square centimeter and preferably between 2.25 and 3.5 watts per square centimeter. The substrate temperature during deposition is maintained between about 100° C. and 600° C., preferably between 200° C. and 400° C. The resulting film consisted essentially of zirconium titanium oxide and contained less than 5 ppm lead introduced as impurity in the ceramic powders.

Following sputtering, film is annealed to densify the oxide and to develop a fine crystalline microstructure effective to increase the dielectric constant to between about 25 and 60. Annealing of the oxide may be carried out either in air or in a non-oxidizing atmosphere, such as nitrogen. In air the film is heated at a temperature between about 700° C. and 875° C. and preferably between 750° C. and 825° C., for a time between about 5 and 30 minutes. Alternately, anneal in nitrogen may be carried out at a higher temperature between 850° C. and 1050° C., preferably between 925° C. and 1025° C.

In an alternate embodiment, a zirconium titanium oxide film may be applied by reactive sputtering utilizing a target formed of metallic zirconium and titanium and carried out in an oxygen atmosphere. Following deposition, the oxide is annealed to develop the desired crystallization and dielectric constant.

Following annealing of film 16, lead zirconium titanate is sputtered onto film 16 to form thin film 18. Sputtering is suitably carried out in an RF magnetron sputtering apparatus, utilizing ceramic targets prepared by mixing powders of lead oxide, zirconium dioxide and titanium dioxide in the desired proportions. Sputtering conditions are comparable to those utilized in applying layer 16, except that the substrate temperature is maintained between about 350° C. and 650° C., and preferably between about 400° C. and 550° C. Following sputtering, the lead zirconium titanate is annealed to densify the material and to develop the perovskite microstructure that provides the desired piezoelectric properties. Annealing is carried out in air at a temperature between about 650° C. and 825° C., and preferably between 700° C. and 800° C.

Following annealing, transducers 20 through 26 are formed by sputtering aluminum utilizing a mask.

By way of a specific example, using a mixture of the oxide powders, a first film 16 was sputtered onto a silicon substrate in an atmosphere composed of about 10 parts argon and 1 part oxygen and having a pressure of about 10 millitorr. The substrate temperature was about 400° C. The resulting layer had a thickness of about 1000 Angstroms and was characterized by $Zr_{0.5}Ti_{0.5}O_4$. The film was annealed at 825° C. in air, and exhibited a dielectric constant of about 40. Thereafter, a second film 18 was sputtered directly onto the annealed film 16. The second film was formed of a lanthanum-modified lead zirconium titanate compound characterized by the formula

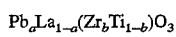
$$Pb_aLa_{1-a}(Zr_bTi_{1-b})O_3$$

where a is between about 0.91 and 0.98 and b is between 0.52 and 0.65. Sputtering was carried out in a 10:1 argon:oxygen atmosphere at a pressure of 10 millitorr and onto a substrate temperature of about 400° C. Following deposition, the film was annealed at 750° C. in air for 2 hours.

Therefore, this invention provides a device comprising a substrate, a lead-free zirconium titanate film applied directly onto the substrate, and a lead oxide-containing piezoelectric film applied onto the lead-free film. While not being limited to any particular theory, it is believed that the lead-free oxide layer provides a barrier to prevent lead oxide reaction with silicon at the substrate surface that would otherwise form unwanted glass phases, particularly during heating to the temperatures required for anneal. Of equal consideration, the barrier film is formed of a dielectric material and provides a smooth base for receiving the outer film. As a result, the barrier film does not significantly reduce the piezoelectric properties of the lead zirconium titanate layer. In general, piezoelectric layer of lead zirconium titanate exhibit a dielectric constant on the order of 1000, which constant may be affected by the adjacent materials. For the barrier film in the preferred embodiment, oxides having a proportion of zirconium greater than about 0.65 based upon the total metal (i.e., the total of zirconium and titanium) display a low dielectric constant that tends to reduce the dielectric constant of the piezoelectric layer. On the other hand, a proportion of zirconium less than about 0.3 increases the breakdown voltage of the barrier oxide that is desired to electrically isolate the substrate from the piezoelectric layer. Oxides having a proportion of zirconium between a bout 0.4 and 0.6 are preferred. Similarly, a barrier film having a thickness of at least about 750 Angstroms is desired to obtain a high dielectric constant in the piezoelectric layer. On the other hand, no additional improvement is obtained using zirconium titanium films having a thickness greater than about 2500 Angstroms. As in the described embodiment, it is preferred to anneal the zirconium titanium film prior to depositing the lead zirconium titanate to provide a dense barrier having a smooth surface. This anneal is suitably accomplished within a practical time at temperatures above about 700° C., while temperatures above about 875° C. tends to produce surface crystallization, resulting in unwanted roughness.

While this invention has been disclosed in terms of a piezoelectric film applied to a silicon substrate, it may be readily adapted for applying a piezoelectric film to a substrate formed of gallium arsenide. The presence of a lead-free film intermediate the substrate and the lead-containing compound serves as a barrier to inhibit diffusion of lead that would otherwise have a deleterious effect upon the electrical properties of the gallium arsenide.

In the described embodiment, spaced sets of transducers were applied to the piezoelectric surface to form a SAW filter. Alternately, this invention may be utilized in forming other products that employ a piezoelectric lead zirconium titanate film applied to a substrate formed of silicon or gallium arsenide, including non-volatile memory devices, referred to as FRAMs.

While this invention has been described in terms of certain embodiments thereof, it is not intended to be limited to those embodiments, but rather only to the extent set forth in the claims that follow.

The embodiments of the invention in which an exclusion property or privilege is claimed are defined as follows:

1. A method for coating a piezoelectric film onto a substrate selected from the group consisting of silicon and gallium arsenide, said method comprising depositing a first film onto the substrate, said first film being composed of a lead-free zirconium titanate compound having the formula $$Zr_yTi_{1-y}O_4$$

where y is between about 0.3 to 0.65, annealing the first film by heating at a temperature and for a time effective to densify the lead-free zirconium titanate compound to form an annealed first film having a dielectric constant between about 25 and 60, depositing a second film onto the annealed first layer, said second film being composed of a lead zirconate titanate compound characterized by the formula $$Pb_aM_{1-a}(Zr_bTi_{1-b})O_3$$

where M is a metal selected from the group consisting of lanthanum, niobium, antimony, tungsten, tantalum, barium, strontium, neodymium, and tin and a is between about 0.9 and 1.0 and b is between about 0.5 and 0.7, and heating the second film to a temperature and for a time effective to produce piezoelectric properties.

2. A method in accordance with claim 1 wherein y is between 0.4 and 0.6.

3. A method in accordance with claim 1 wherein M is lanthanum.

4. A method in accordance with claim 1 wherein the step of depositing the second film comprises sputtering the lead zirconium titanate compound onto the first film to form the second film having a thickness between about 2 and 10 microns.

5. A method in accordance with claim 1 wherein the step of depositing the first film comprises sputtering the lead-free zirconium titanate compound onto the substrate to form the first film having a thickness between about 750 and 2500 Angstroms.

6. A method for coating a piezoelectric film onto a silicon substrate, said method comprising sputtering a lead-free zirconium titanate compound onto the substrate to form a first film having a thickness between about 750 and 2500 Angstroms, said lead-free zirconium titanate compound having the formula $$Zr_yTi_{1-y}O_4$$

where y is between about 0.3 to 0.65, annealing the first film by heating at a temperature effective to densify the lead-free zirconium titanate compound, sputtering a lead zirconium titanate compound onto the annealed first film to form a second film having a thickness between about 2 and 10 microns, said lead zirconate titanate compound having the formula $$Pb_aM_{1-a}(Zr_bTi_{1-b})O_3$$

where M is a metal selected from the group consisting of lanthanum, niobium, antimony, tungsten, tantalum, barium, strontium, neodymium, and tin and a is between about 0.9 and 1.0 and b is between about 0.5 and 0.7, and annealing the second film by heating at a temperature effective to produce piezoelectric properties.

7. A method in accordance with claim 6 wherein the step of annealing the first film comprises heating the first film in air at a temperature between about 700° C. and 875° C.

8. A method in accordance with claim 6 wherein the step of annealing the first film comprises heating the first film in air at a temperature between about 750° C. and 825° C.

9. A method in accordance with claim 6 wherein the step of annealing the first film comprises heating the first film in a non-oxidizing atmosphere at a temperature between about 850° C. and 1050° C.

10. A method in accordance with claim 6 wherein the step of annealing the first film comprises heating the first film in a non-oxidizing atmosphere at a temperature between about 925° C. and 1025° C.

11. A method in accordance with claim 6 wherein the step of annealing the second film comprises heating the second film in air at a temperature between about 700° C. and 800° C.

* * * * *